United States Patent [19]

Aoyama

[11] Patent Number: 4,730,280

[45] Date of Patent: Mar. 8, 1988

[54] SEMICONDUCTOR MEMORY DEVICE HAVING SENSE AMPLIFIERS WITH DIFFERENT DRIVING ABILITIES

[75] Inventor: Keizo Aoyama, Yamato, Japan

[73] Assignee: Fujitsu Limited, Kanagawa, Japan

[21] Appl. No.: 798,783

[22] Filed: Nov. 18, 1985

[30] Foreign Application Priority Data

Nov. 20, 1984 [JP] Japan .............................. 59-245801
Nov. 20, 1984 [JP] Japan .............................. 59-245803

[51] Int. Cl.$^4$ ................................................ G11C 7/00
[52] U.S. Cl. ..................................... 365/205; 365/190
[58] Field of Search ............... 365/189, 190, 205, 207, 365/208

[56] References Cited

U.S. PATENT DOCUMENTS

| | | | |
|---|---|---|---|
| 4,286,178 | 8/1981 | Rao et al. .............................. | 365/205 |
| 4,287,576 | 9/1981 | Pricer ................................... | 365/208 |
| 4,542,483 | 9/1985 | Procyk .................................. | 365/190 |
| 4,590,588 | 5/1986 | Itoh et al. ............................. | 365/189 |

FOREIGN PATENT DOCUMENTS 0101093  6/1984  Japan .................................. 365/205

Primary Examiner—Stuart N. Hecker
Assistant Examiner—Glenn A. Gossage
Attorney, Agent, or Firm—Armstrong, Nikaido, Marmelstein & Kubovcik

[57] ABSTRACT

A semiconductor memory device, whose pairs of bit lines are connected to a pair of data buses, are divided into a plurality of blocks each comprising a plurality of parted memory cells, a pair of switching elements, and a block sense amplifier. The block sense amplifier has different driving abilities respectively so that the sense amplifier in the farthest block from the data bus has the most driving ability, the sense amplifier in the block nearer to the data bus has less driving ability, and the sense amplifier in the nearest block to the data bus has the least sensing ability. There is only one sense amplifier activated in a selected block, which is a block having a memory cell to be accessed. The operation of the pair of switching elements in a respective block is made after the sense amplifier in the selected block is activated so that the pairs of switching elements in the selected block and the blocks closer to the data bus looking from the selected block are turned ON.

2 Claims, 11 Drawing Figures

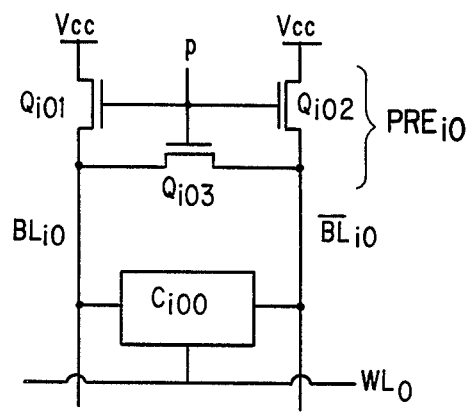
FIG. 3(a)
PRIOR ART
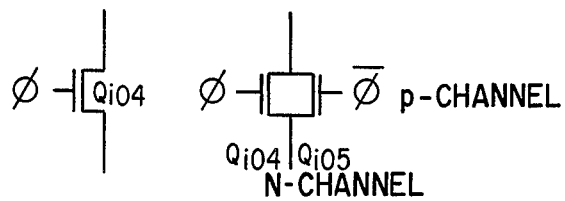
FIG. 3(b)
PRIOR ART
FIG. 3(c)
PRIOR ART

SEMICONDUCTOR MEMORY DEVICE HAVING SENSE AMPLIFIERS WITH DIFFERENT DRIVING ABILITIES

BACKGROUND OF THE INVENTION

The present invention relates to a semiconductor memory device, and more particularly to a semiconductor memory device (memory device) whose respective pair of bit lines is divided into a plurality of blocks each comprising memory cells, a sense amplifier, and switching elements.

Recently, memory devices have a great deal of memory capacity, so that the amount of memory cells in a device tremendously increases with a lot of word lines and bit lines connected to the memory cells. Accordingly, the stray capacitance distributed along the word and bit lines increases, which lowers the operation speed of the memory device. This problem with the bit line (usually a pair of bit lines) has been improved by dividing the pair of bit lines into a plurality of blocks. One improvement has been disclosed in Japanese Laid-open Patent Application No. 59-101093 in 1984. One difference between the present invention and the Laid-open Patent Application is that the driving ability of the sense amplifier in respective blocks is changed in the present invention. On the otherhand, in the Laid-open Patent, all the sense amplifiers have an equal driving ability.

FIG. 1 is a block and circuit diagram of a part of a usual memory device. Memory cells in the usual memory device, having the memory capacity of 64 kilo (K) bits or 256 K bits are arranged in a matrix as shown in FIG. 1, in which reference symbols $C_{00}$, $C_{01}$, - - -, and $C_{0n}$ are memory cells in a 0-th column; $C_{10}$, $C_{11}$, - - -, $C_{1n}$ are memory cells in a 1-st column; $C_{i0}$, $C_{i1}$, - - -, and $C_{in}$ are memory cells in an i-th column; and $C_{n0}$, $C_{n1}$, - - -, and $C_{nn}$ are memory cells in an n-th column. Each memory cell is positioned at each cross point of a respective word line and a pair of bit lines where reference symbols $WD_0$, $WD_1$, - - -, and $WD_n$ are the 0-th, the 1-st, - - -, and the n-th word line respectively, and $BL_0$, $\overline{BL_0}$; $BL_1$, $\overline{BL_1}$; - - -; $BL_i$, $\overline{BL_i}$, - - -; $BL_n$, $\overline{BL_n}$ are the 0-th, the 1-st, - - -, the i-th, - - -, and the n-th pair of bit lines respectively. Each pair of bit lines has a respective column decoder where a reference symbol $CD_i$, shown in FIG. 1, is a column decoder for the i-th pair of bit lines. Similarly, each word line has a respective word decoder where a reference symbol $WD_i$, in FIG. 1, is a word decoder for the i-th word line. When the memory device is in a read mode and word line select signals $X_0$, $X_1$, - - -, and $X_n$ and column select signals $Y_0$, $Y_1$, - - -, and $Y_n$ are applied to the word and the column decoders, a designated memory cell is selected and a data signal stored in the designated memory cell is read out. For example, when word decoder $WD_i$ and column decoder $CD_i$ function together by the word line and column select signals $X_i$ and $Y_i$ respectively, the data signal stored in memory cell $C_{ii}$ is read out and column decoder $CD_i$ functions for sending the read out data signal to a pair of data bus DB, $\overline{DB}$. The read out data signal sent to the data bus DB, $\overline{DB}$ is amplified by a sense amplifier SA placed in data bus DB and $\overline{DB}$.

However, when the memory capacity of the memory device increases as much as mega (M) bits, the number of memory cells also increases, and the stray capacitance distributed along each pair of bit lines also increases when compared with the memory capacitance provided in each memory cell. Thus, the operation speed of the memory device for writing or reading a data signal into or out from the memory cell is lowered and it becomes difficult to obtained a good signal to noise ratio. This causes a reduction in the operational reliability of the memory device. To obliterate the problem, the technique of dividing each pair of bit lines into a plurality of blocks has been developed. FIG. 2 shows a case of dividing the i-th pair of bit lines $BL_i$, $\overline{BL_i}$ into k blocks like $BK_{i0}$, $BK_{i1}$, - - -, and $BK_{ik}$. In FIG. 2, each block comprises a pair of divided bit lines, a plurality of parted memory cells, a block sense amplifier, and a pair of switching elements. For example, block $BK_{ik}$ has a pair of divided bit lines $BL_{ik}$, $\overline{BL}_{ik}$, a plurality of parted memory cells $C_{ik0}$, $C_{ik1}$, - - -, and $C_{ikm}$, a block sense amplifier $SA_{ik}$, and a pair of switching elements $S_{ik}$, $\overline{S}_{ik}$, where, the number "m" is set so that the number "n" shown in FIG. 1 is equal to "k" times as many as "m".

In FIG. 2, when one of the parted memory cells is selected by one of the word select signals $X_0 \sim X_n$ (see FIG. 1), one of the block select signals $BS_{i0}$, $BS_{i1}$, - - -, and $BS_{ik}$ is designated, and the designated block select signal activates a block sense amplifier in the selected block. Then, the selected block sense amplifier amplifies a data signal stored in the selected memory cell. Pairs of switching elements $S_{i0}$, $\overline{S}i0$; $S_{i1}$, $\overline{S}_{i1}$; - - -; and $S_{ik}$, $\overline{S}_{ik}$ are inserted in the pairs of bit lines in the blocks respectively for connecting the blocks in series. Column decoder $CD_i$ is inserted between a block ($BK_{ik}$), which is nearest to the pair of bus lines DB, $\overline{DB}$, and the pair of bus lines DB, $\overline{DB}$. When column select signal $Y_i$ designates the i-th column, transfer gates $Q_1$ and $Q_2$, provided in column decoder $CD_i$, turn ON for sending the data signal, which is amplified by the selected block sense amplifier, to the pair of bus lines DB, $\overline{DB}$.

Further detail of circuits in the block and its operation will be explained with reference to FIG. 3 when the memory device is in the read mode.

FIG. 3(a) is a bit line pre-charge circuit provided in respective block, while FIGS. 3(b) and 3(c) are the switching elements either one of which is provided in the respective block. FIGS. 3(a), 3(b), and 3(c) show a block $BK_{i0}$. FIG. 3(a) shows a pre-charge circuit $PRE_{i0}$ which comprises transistors $Q_{i01}$, $Q_{i02}$, and $Q_{i03}$ for applying equally pre-charging potential $(V_{cc} - V_{th})$ onto pair of bit lines $BL_{i0}$, $\overline{BL}_{i0}$ when a pre-charge signal p is applied to the gates of transistors $Q_{i01}$, $Q_{i02}$, and $Q_{i03}$. A transistor $Q_{i04}$ shown in FIG. 3(b) is for switching element $S_{i0}$ or $\overline{S}i0$ shown in FIG. 2. The transistor $Q_{i04}$ turns ON when a clock signal $\phi$ is applied to its gate. FIG. 3(c) also shows another type of the switching element which consists of a transistor $Q_{i04}$, which is the same as the one in FIG. 3(b), and a transistor $Q_{i05}$, which is connected in parallel to the transistor $Q_{i04}$. Transistor $Q_{i05}$ is a reverse conduction type transistor when compared to transistor $Q_{i04}$. The switching element turns ON when clock signals $\phi$, $\overline{\phi}$ are simultaneously applied to the gates of transistors $Q_{i04}$ and $Q_{i05}$ respectively.

The circuit of FIG. 2 sequentially operates in following steps: (1) one word line is selected by a word line select signal $X_0$, $X_1$, - - -, or $X_n$ (see FIG. 1); for example, a word line $WL_0$ is selected by word line select signal $X_0$; (2) one column is selected by a column select signal $Y_0$, $Y_1$, - - -, or $Y_n$; for example, column i is selected by column select signal $Y_i$; (3) a memory cell located at a cross point of the selected word line and column is selected; for example, memory cell $C_{i00}$ in block $BK_{i0}$ is selected; (4) one block select signal is provided when a word line and a column are selected; for example, block select signal $BS_{i0}$ is selected; (5) one block sense amplifier is activated by the block select signal, so that a voltage difference appearing between bit lines in the selected block is amplified; for example, block sense amplifier $SA_{i0}$ is activated by block select signal $BS_{i0}$, so that a voltage difference appearing between bit lines $BL_{i0}$, $\overline{BL}_{i0}$ is amplified; (6) after the voltage difference is amplified by the selected block sense amplifier, all switching elements in the selected column are turned ON so that all blocks of the selected column are connected in series; for example, after the voltage difference appearing between bit lines $BL_{i0}$, $\overline{BL}_{i0}$ is amplified by block sense amplifier $SA_{i0}$, all switching elements $S_{i0}$, $\overline{S}_{i0}$; $S_{i1}$, $\overline{S}_{i1}$; - - - ; and $S_{ik}$, $\overline{S}_{ik}$ are turned ON so that all blocks $BK_{i0}$, $BK_{i1}$, - - - , and $BK_{ik}$ are connected in series; and (7) the transfer gates in a column decoder belonging to the selected column are turned ON by a column select signal for feeding the amplified data signal onto data bus DB, $\overline{DB}$; for example, transfer gates $Q_{i1}$, $\overline{Q}_{i1}$ in column decoder $CD_i$ are turned ON by column select signal $Y_i$ for feeding the amplified data signal onto data bus DB, $\overline{DB}$.

In the above explanation (6), "all switching elements" are not always turned ON, but at least the switching elements in the selected block and in the blocks locating between the selected block and column decoder $CD_i$ are turned ON.

In addition, in the prior art, all other block sense amplifiers can be activated after the selected block sense amplifier has been activated and the switching elements have been turned ON.

As explained above, in the prior art, the load capacitance for the sense amplifier can be kept small the first time the block sense amplifier in the selected block is activated. However, when the blocks locating between the selected block and column decoder $CD_i$ are connected to the data bus, the load capacitance for the selected block sense amplifier increases. For example in FIG. 2, when block $BK_{i0}$ is selected and sense amplifier $SA_{i0}$ is activated and the switching elements connect the all blocks, the load capacitance becomes a total sum of capacitance along the bit lines in column i. Accordingly, the sense amplifier in the farthest block from the data bus, for example sense amplifier $SA_{i0}$ in block $BK_{i0}$, must have a great enough driving ability to amplify the voltage difference in a short enough time. Furthermore, each sense amplifier has an equal driving ability, so if a sense amplifier in the nearest block from the data bus, for example sense amplifier $SA_{ik}$ in block $BK_{ik}$, is selected, the sense amplifier ($SA_{ik}$) wastes too much power, which has been a problem in the prior art.

SUMMARY OF THE INVENTION

An object of the present invention is to increase the operation speed of a semiconductor memory device.

Another object of the present invention is to decrease the power consumption of the semiconductor memory devise.

Yet another object of the present invention is to increase the operational reliability of the semiconductor memory device.

The above objects are achieved by changing the driving ability of the block sense amplifier in respective blocks so that the driving ability increases as the block is located farther from the data bus while the driving ability decreases as the block is located closer to the data bus.

BRIEF DESCRIPTION OF THE DRAWINGS

FIG. 3(a) is a circuit diagram of a conventional precharge circuit used in a divided block of the column part in the memory device of the prior art or the present invention;

FIG. 3(b) is a circuit diagram of a conventional switching element used in a block of the column part in the memory device of the prior art or the present invention;

FIG. 3(c) is a circuit diagram of another conventional switching element used in a block of the column part in the memory device of the prior art or the present invention;

DESCRIPTION OF THE PREFERRED EMBODIMENTS

Figure 2:
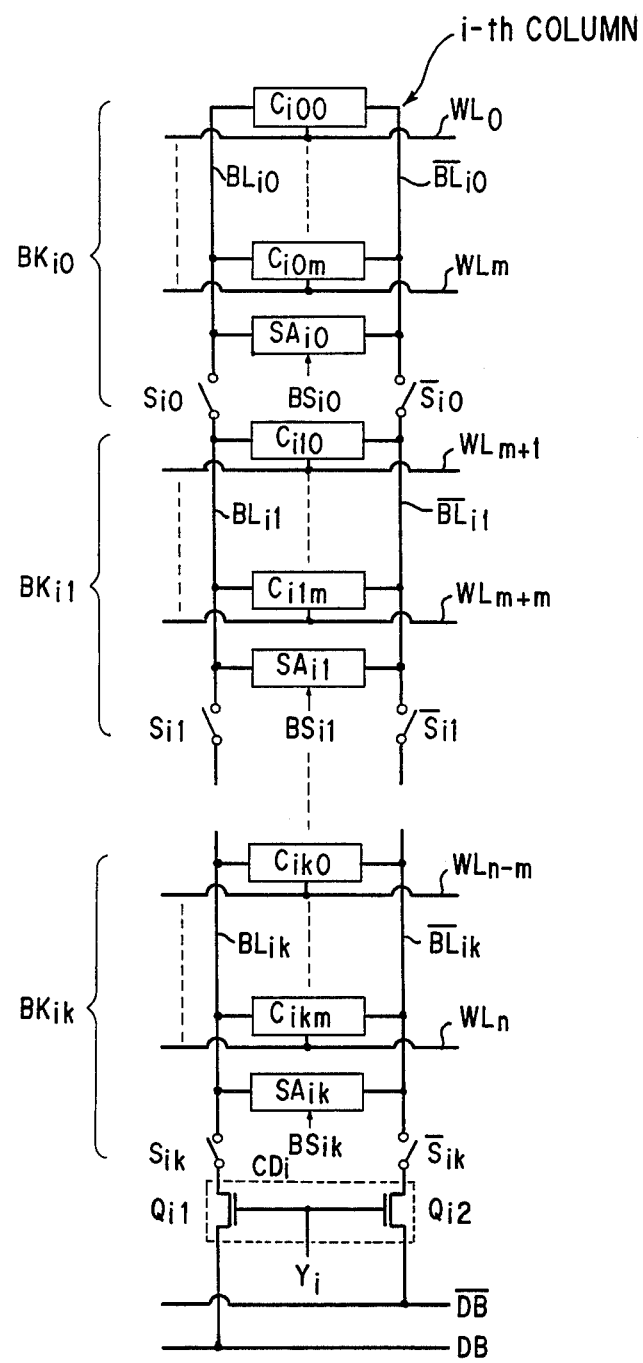
FIG. 2 is a block and circuit diagram of a column part in the prior art memory device.
Figure 4:
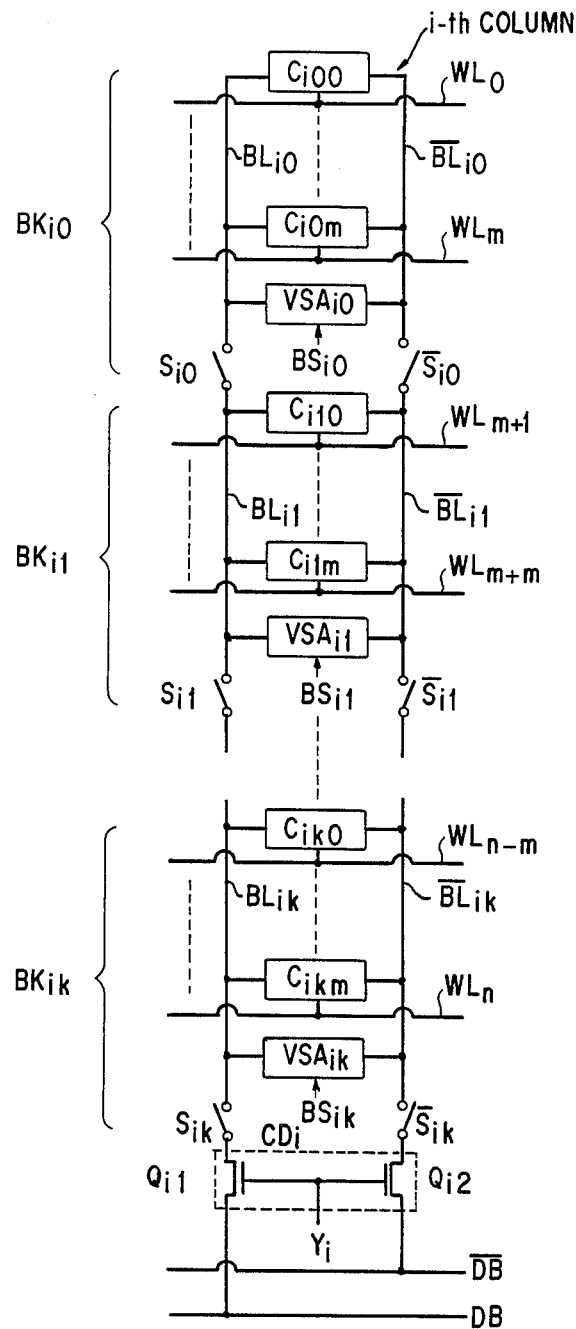
FIG. 4 is a block and circuit diagram of a column part in a memory device embodying the present invention.

FIG. 4 is a block and circuit diagram of a part of the memory device embodying the present invention. The block and circuit diagram in FIG. 4 has the same configuration of the prior art shown in FIG. 2, and in FIG. 4, those parts having the same symbol as those in FIG. 2 function equivalent to those in FIG. 2. Symbols $VSA_{i0}$, $VSA_{i1}$, - - - , $VSA_{ik}$ are the block sense amplifiers similar to the block sense amplifiers in FIG. 2 but their driving ability are individually different so that a block sense amplifier located farthest from column decoder $CD_i$ or data bus DB, $\overline{DB}$ has the maximum driving ability and a block sense amplifier located nearest to data bus DB, $\overline{DB}$ has the minimum driving ability.

Figure 1:
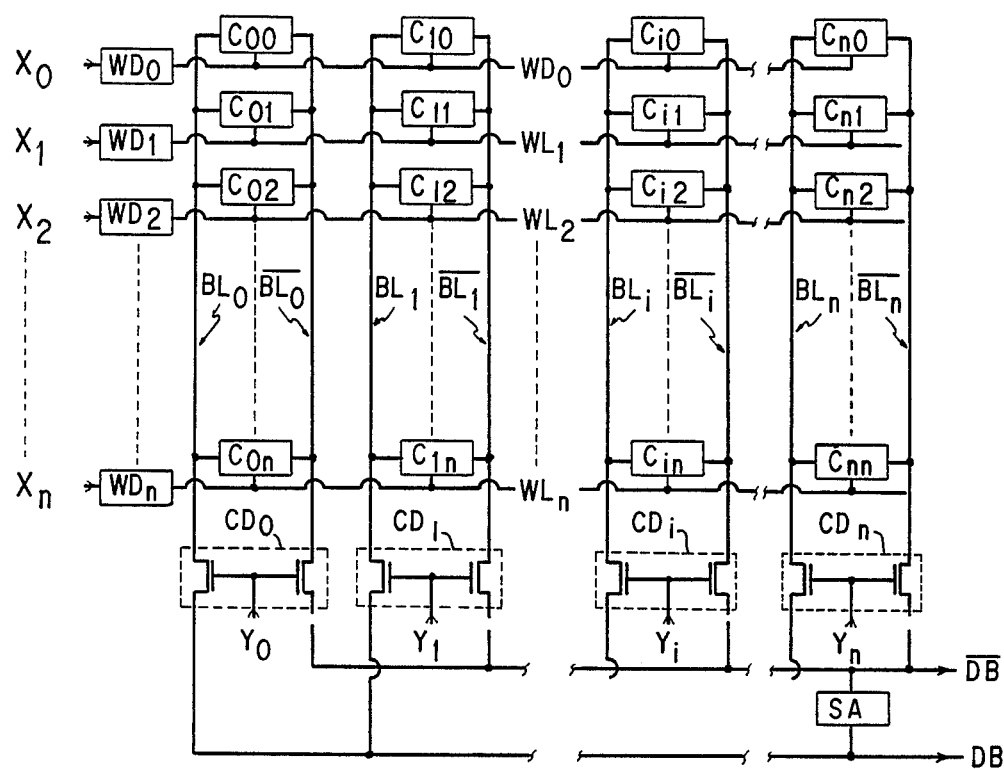
FIG. 1 is a block and circuit diagram of a prior art memory device whose column part is not divided into blocks.

In FIG. 4, for example, when a data signal stored in memory cell $C_{i10}$ located in the i-th column and block $BK_{i1}$ is read out, the memory device functions as follows: (1) the i-th column is selected when column select signal $Y_i$ is applied to column decoder $CD_i$ (see FIG. 1); (2) a word line $WL_{m+1}$ relating to memory cell $C_{i10}$ is selected and block select signal $BS_{i1}$ is provided, so that sense amplifier $VSA_{i1}$ is activated by block select signal $BS_{i1}$, then a voltage difference appearing between bit lines $BL_{i1}$, $\overline{BL}_{i1}$ due to the data signal stored in memory cell $C_{i10}$ is amplified; and (3) switching elements $S_{i1}$, $\overline{S}_{i1}$; $S_{i2}$, $\overline{S}_{i2}$; - - - , and $S_{ik}$, $\overline{S}_{ik}$ in the selected block $BK_{i1}$ and blocks $BK_{i2}$, $Bk_{i3}$, - - - , and $BK_{ik}$ located between the selected block $BK_{i1}$ and column decoder $CD_i$ are turned ON for connecting bit lines $BL_{i1}$, $\overline{BL}_{i1}$ to data bus DB, $\overline{DB}$ through column decoder $CD_i$. (Switching elements $S_{ik}$, $\overline{S}_{ik}$ in the nearest block $BK_{ik}$ to the data bus can be omitted because they are always used.) The above control for the switching elements are made by modified clock signals which are generated in a modified clock signal generator shown in FIG. 5.

Figure 5:
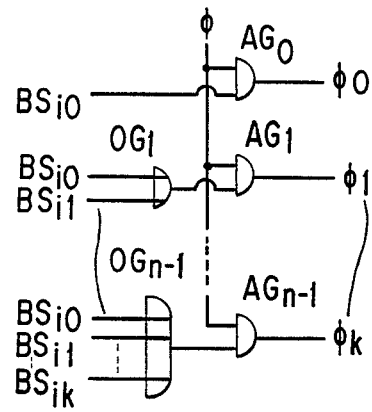
FIG. 5 is a circuit diagram of a modified clock signal generator embodying the present invention.

The modified clock signal generator shown in FIG. 5 generates modified clock signals $\phi_0$, $\phi_1$, ---, and $\phi_k$ for controlling switching elements $S_{i0}$, $\overline{S}_{i0}$; $S_{i1}$, $\overline{S}_{i1}$, ---; and $S_{ik}$, $\overline{S}_{ik}$ ON or OFF respectively. The modified clock signals are similar to clock signal $\phi$ shown in FIGS. 3(a) and (b), however, they control the switching elements as follows: all of the modified clock signals are required only when the farthest block (block $BK_{i0}$) from data bus DB, $\overline{DB}$ is selected. When a block nearer than block $BK_{i0}$ to the data bus is selected, modified clock signals, for blocks located farther from the data bus than the selected block, become unnecessary. For example, when block $BK_{i1}$ is selected, it is not necessary to generate a modified clock signal $\phi_0$ for switching elements $S_{i0}$, $\overline{S}_{i0}$ in block $BK_{i0}$, and when block $BK_{ik}$ is selected, only clock signal $\phi_k$ is necessary. The above selection of the modified clock signals is made in the modified clock signal generator by properly combining the block select signals $BS_{i0}$, $BS_{i1}$, ---, and $BS_{ik}$. In FIG. 5, OR gates $OG_1$, $OG_2$, ---, and $OG_k$ create the above logic, and AND gates $AG_0$, $AG_1$, ---, and $AG_k$ produce the modified clock signals every time when clock signal $\phi$ is applied to the AND gates.

Thus, applying the modified clock signal generator to the memory device, the bit lines in the selected block and the blocks located between the selected block and the data bus can be connected. Accordingly, the load capacitance of the activated sense amplifier can be reduced as small as possible. For example, when block $BK_{i1}$ is selected, the stray capacitance appearing along bit lines $BL_{i0}$, $\overline{BL}_{i0}$ cannot influence sense amplifier $SA_{i0}$.

Since upper blocks, meaning the blocks located farther from the data bus than the selected block, are not used, the pre-charge circuits (or a bit line reset circuit), explained in FIG. 3(a), in the upper blocks can be controlled so that their operation is excluded. This will also contribute to saving power consumption.

As explained before, the sense amplifier in the selected block operates first. Then, the switching elements in the lower blocks, which are the blocks located between the selected block and the data bus, turn ON. Accordingly, when the pairs of bit lines in the lower blocks are connected to the pair of bit lines in the selected block, the voltage difference, which appears between the bit lines in the selected block, decreases due to the stray capacitance and the potential of the bit lines in the lower blocks. This causes an increase in the time needed to access the memory device. Accordingly, the access time depends on the location of the selected block. For example, when the selected block is located far from the data bus, the access time increases. The load capacitance for the sensing amplifier in the selected block is actually the sum of the stray capacitance of the lower blocks and the data bus. Therefore, when the sensing amplifier in each block has the same driving ability, like the prior art, the load capacitance of the sensing amplifier, in a block placed farther from the data bus, becomes hard to drive in a short access time due to its load capacitance. If the driving ability is made large enough to sufficiently shorten the access time, each sense amplifier must have as large a driving ability as the farthest sense amplifier has. This causes a large waste in power when the sense amplifiers nearest to the data bus are selected. Accordingly, the present invention improve this problem by changing the driving ability of the sensing amplifier in the respective block. This is done so that the farther block from the data bus has more driving ability. For example, in FIG. 4, sense amplifier $VSA_{i0}$ has the maximum driving ability and the driving ability becomes smaller as the block is located nearer to the data bus. By doing so, the increase of the load capacitance can be compensated by the increase in the driving ability so that the access time in all block can be equalized.

Figure 6:
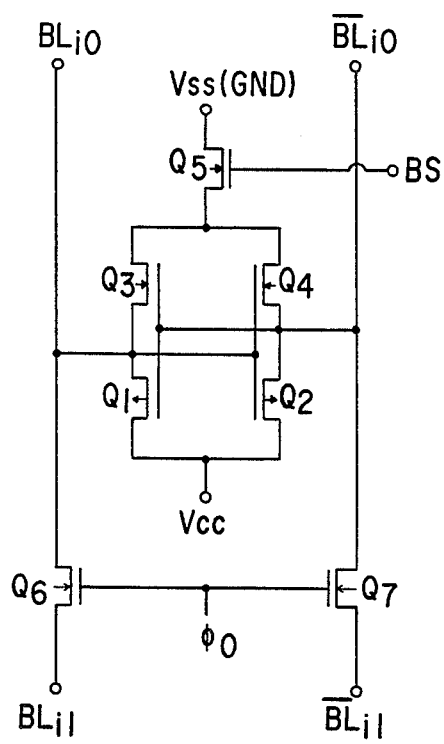
FIG. 6 is a circuit diagram of a block sense amplifier embodying the present invention.
Figure 7A:
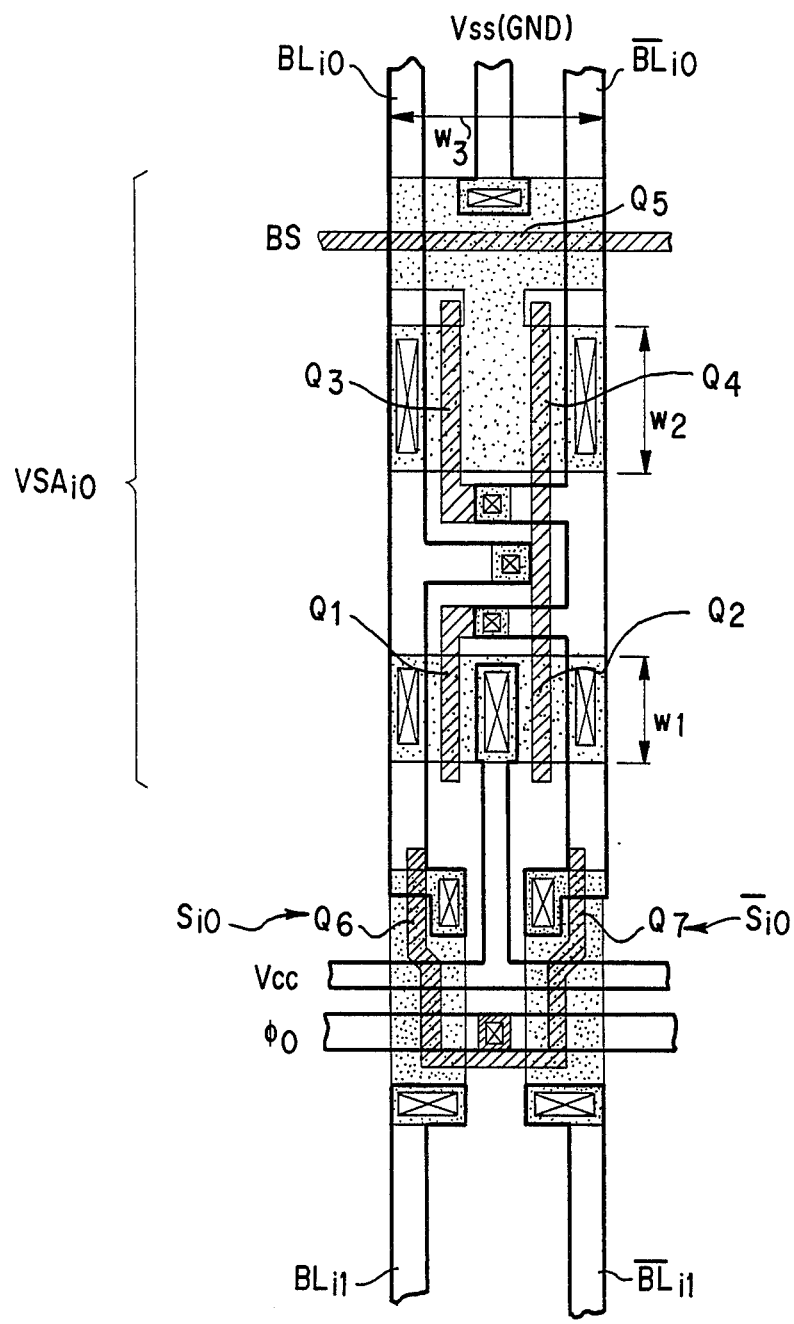
FIG. 7(a) is a plan view of the pattern of a block sense amplifier embodying the present invention in a block located farthest from the data bus of the semiconductor memory device embodying the present invention.
Figure 7B:
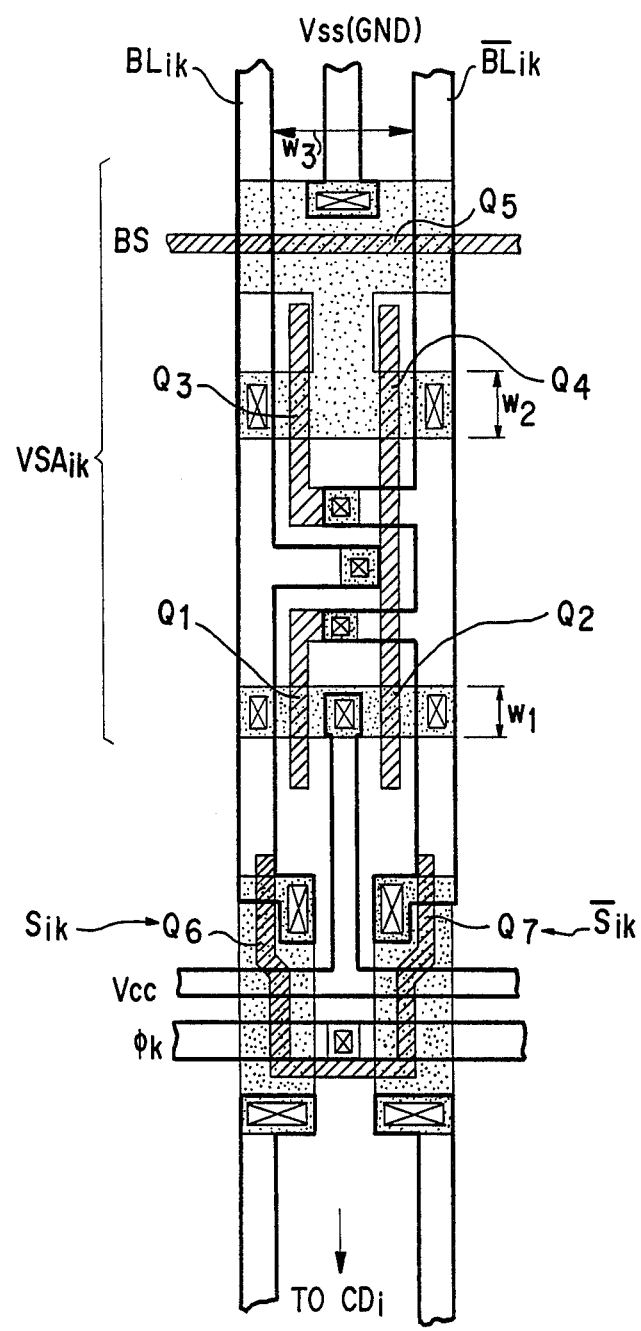
FIG. 7(b) is a plan view of the pattern of a block sense amplifier embodying the present invention in a block located nearest to the data bus of the semiconductor memory device embodying the present invention.

FIG. 6 shows a circuit diagram of the block sense amplifier with a pair of switching elements in block $BK_{i0}$ for example. In FIG. 6, symbols $Q_1$ and $Q_2$ are p-channel MOS (Metal Oxide Semiconductor) transistors, symbols $Q_3$, $Q_4$, and $Q_5$ are n-channel MOS transistors, symbol $V_{SS}$ is a low power supply voltage (usually ground (GND)), symbol $V_{CC}$ is a high power supply voltage, symbol BS is a block select signal, and other symbols are equal to those in FIG. 2 and function similar to those in to FIG. 2. Transistors $Q_1$ and $Q_3$, and transistors $Q_2$ and $Q_4$ compose a CMOS (Complementary MOS) invertor respectively, and the two CMOS invertors intersect each other forming a flip-flop circuit. Transistor $Q_5$ turns ON by receiving a block select signal BS, activating the sense amplifier. Symbols $Q_6$ and $Q_7$ are n-channel MOS transistors which are the switching elements in which each are the same type to that shown in FIG. 3(b). In the present invention, the driving ability of the respective block sense amplifier is different, and the difference is made by changing the channel size of transistors $Q_1$, $Q_2$, $Q_3$, and $Q_4$. FIGS. 7(a) and (b) show the plan views of the IC (Integrated semiconductor Circuit) pattern for the circuit of FIG. 6. FIG. 7(a) shows the block sense amplifier having the maximum driving ability, and FIG. 7(b) shows the block sense amplifier having the minimum driving ability. In FIGS. 7(a) and (b), a dotted area is a pattern for a limited diffusion zone, a shadowed area is a pattern for the gate material made of Poly-Silicon, an X-marked portion shows a window for an Al (Aluminum) contact, and an area enclosed by the thick line is a pattern of an Al wiring. In FIGS. 7(a) and (b), symbol $w_1$ shows the channel size for transistors $Q_1$ and $Q_2$, symbol $w_2$ shows the channel size for transistors $Q_3$ and $Q_4$, and symbol $w_3$ shows the channel size for transistor $Q_5$. For example, when the memory device is a class having a M-bit memory capacity and each size of a middle block sense amplifier, which is a block sense amplifier in a block locating at the middle of the column, is set as a standard, the ratio of each channel size against the respective standard becomes as follows: when the driving ability is the maximum, size $w_1$, $w_2$, and $w_3$ increase as much as forty percent in length respectively when compared with those of the middle block sense amplifier as shown in FIG. 7(a); when the driving ability is the minimum, size $w_1$, $w_2$, and $w_3$ decrease to as small as sixty percent of those of the middle block sense amplifier respectively as shown in FIG. 7(b).

Figure 8:
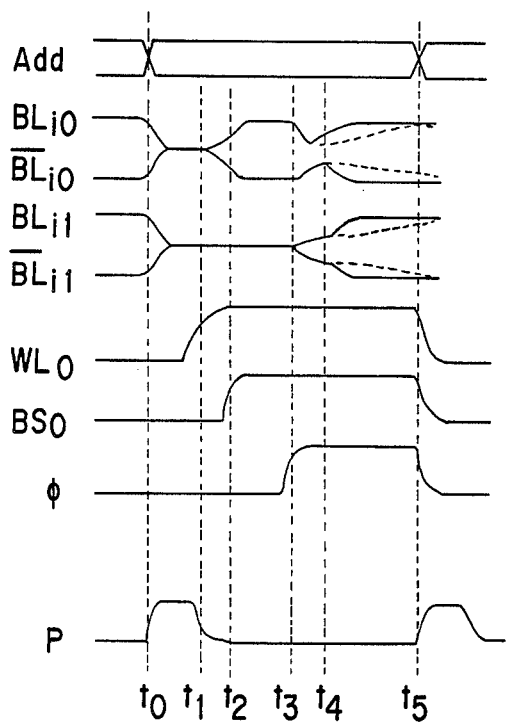
FIG. 8 is a time chart for illustrating the operation of the memory device embodying the present invention.

FIG. 8 is a time chart for illustrating the operation of the memory device shown in FIG. 4. When the amplitude of an address signal $A_{dd}$ changes at time $t_0$, a pre-charge signal p is generated so that the all pairs of bit lines $BL_{i0}$, $\overline{BL}_{i0}$; $BL_{i1}$, $\overline{BL}_{i1}$; ---; and $BL_{ik}$, $\overline{BL}_{ik}$ shown in FIG. 4 are charged to an equal value like $V_{cc}-V_{th}$ for example. Then when word line $WL_0$ is selected (see FIGS. 3 and 4) at time $t_1$, memory cell $C_{i00}$ in the column i is selected, and a small voltage difference on bit lines $BL_{i0}$, $\overline{BL}_{i0}$ in block $BK_{i0}$ appears because of the data signal stored in memory cell $C_{i00}$. At time $t_2$, block select signal $BS_{i0}$ becomes high (H) by which sense amplifier $VSA_{i0}$ is activated (transistor $Q_5$ becomes ON in FIG. 6) for amplifying the small voltage difference. After the voltage difference on bit lines $BL_{i0}$, $\overline{BL}_{i0}$ is sufficiently amplified by sense amplifier $VSA_{i0}$, clock signals $\phi_0$, $\phi_1$, - - - , and $\phi_k$ become H at time $t_3$ and all switch elements $S_{i0}$, $\overline{S}_{i0}$; $S_{i1}$, $\overline{S}_{i1}$; - - - ; and $S_{ik}$, $\overline{S}_{ik}$ turn ON (because the farthest block $BK_{i0}$ from the data bus is selected in this example).

In the above example, at the time immediately after the all switch elements are ON, the potential on the bit lines in all other non-selected blocks is a middle value of the pre-charged potential. Accordingly, the H side of bit lines $BL_{i0}$, $\overline{BL}_{i0}$ in selected block $BK_{i0}$ decreases and the L side of them increases. However, since the driving ability of sense amplifier $VSA_{i0}$ is great, the voltage difference appearing on bit lines $BL_{i0}$, $\overline{BL}_{i0}$ (also on other bit lines in the non-selected blocks) rapidly returns back to the value at just before time $t_3$ though the load for sense amplifier $VSA_{i0}$ has the maximum value as stated. The dotted lines in FIG. 8 are the voltage differences on the bit lines in the prior art, which shows the merit of the present invention. As a result, time $t_5$ for changing address $A_{dd}$ can be hastened, which is effective to raise the operation speed of the memory device.

There may be another method in which the sense amplifiers in related other non-selected blocks are activated after related switching elements are turned ON if the selected block is further from the data bus. However, the control of the sense amplifiers in the non-selected blocks becomes too complicated. In the present invention, the control of the sense amplifier can be simply fabricated and complicated control is not required.

Instead of changing the driving ability of each sense amplifier, if all sense amplifiers in all blocks have equal driving ability, the sense amplifier must have the maximum driving ability, otherwise the sense amplifier would have insufficient driving ability when the sense amplifier in the farthest block from the data bus is required to be driven. In the above case however, when the nearest block to the data bus is selected, all sense amplifiers are driven, which allows a waste of power and produces electrical noise because the amplification of the voltage difference is made too much quickly. The noise produces incorrect operation of the memory device.

The above explanation has been made based on a static RAM. However, the present invention can be also applied to the dynamic RAM.

What is claimed is:

1. A semiconductor memory device having a plurality of memory cells arranged in a matrix formed by word lines and bit lines, one end of said bit lines being connected to a data bus, said semiconductor memory device comprising:
   a plurality of blocks provided by dividing each bit line, the plurality of blocks for each bit line comprising a first block which is the farthest block from the data bus, additional blocks being nearer to said data bus one by one, the last block being the nearest block to the data bus, each block containing a plurality of memory cells and being designated as a selected block when one of its associated memory cells is selected for being accessed;
   a plurality of sense amplifiers each placed in an associated block and having a different driving ability respectively, the sense amplifier in a first block having the most driving ability, each sense amplifier in additional blocks located between said first and last blocks having less driving ability the closer it is located to said data bus, the sense amplifier in said last block having the least driving ability, and the sense amplifier in said selected block being the only one initially activated; and
   a switching element inserted into a bit line in each block, the switching element in each block being selectively controlled so as to be ON or OFF after the sense amplifier in the selected block is activated, switching elements in all blocks being turned ON when the first block is designated as the selected block, switching elements in the selected block and blocks nearer to the data bus than said selected block being turned ON and at the same time blocks farther from said data bus than said selected block being OFF when said selected block is located between the first and last blocks, only one switching element in said last block being turned ON when the last block is designated as the selected block.

2. A semiconductor memory device according to claim 1, wherein each of said sense amplifiers comprises a plurality of MOS (Metal Oxide Semiconductor) transistors, the transistors which constitute the sense amplifier in said first block having the widest channel size, the channel size of the transistors which constitute the sense amplifiers in additional blocks located between said first and last blocks having a narrower size than the channel size of the MOS transistors which constitute the sense amplifier in the previous block located closer to the data bus, the channel size of the transistors which constitute the sense amplifier in said last block having the narrowest width.

* * * * *